United States Patent
Ng et al.

(10) Patent No.: US 12,412,811 B2
(45) Date of Patent: Sep. 9, 2025

(54) SPLIT VIA STRUCTURE FOR SEMICONDUCTOR DEVICE PACKAGING

(71) Applicant: Micron Technology, Inc., Boise, ID (US)

(72) Inventors: Hong Wan Ng, Singapore (SG); Seng Kim Ye, Singapore (SG); Kelvin Tan Aik Boo, Singapore (SG); Ling Pan, Singapore (SG); See Hiong Leow, Singapore (SG)

(73) Assignee: Micron Technology, Inc., Boise, ID (US)

( * ) Notice: Subject to any disclaimer, the term of this patent is extended or adjusted under 35 U.S.C. 154(b) by 441 days.

(21) Appl. No.: 17/894,102

(22) Filed: Aug. 23, 2022

(65) Prior Publication Data
US 2024/0071869 A1    Feb. 29, 2024

(51) Int. Cl.
*H01L 21/76* (2006.01)
*H01L 21/768* (2006.01)
*H01L 23/48* (2006.01)
*H01L 23/528* (2006.01)

(52) U.S. Cl.
CPC ...... *H01L 23/481* (2013.01); *H01L 21/76879* (2013.01); *H01L 21/76898* (2013.01); *H01L 23/5283* (2013.01)

(58) Field of Classification Search
CPC ............. H01L 23/481; H01L 21/76879; H01L 21/76898; H01L 23/5283
USPC ....................................................... 257/697
See application file for complete search history.

(56) References Cited

U.S. PATENT DOCUMENTS

2011/0147061 A1*  6/2011  Leung ............... H01L 23/49822
                                                                      174/262

FOREIGN PATENT DOCUMENTS

| JP | 2008211240 A | * | 9/2008 | ........... H01L 21/743 |
| KR | 101506275 B1 | * | 3/2015 | |
| WO | WO-2021140310 A1 | * | 7/2021 | ............. H05K 1/115 |

OTHER PUBLICATIONS

Cite the machine translation Iwaki H (JP-2008211240-A).*
Cite the machine translation Jung J (KR-101506275-B1).*
Cite the machine translation Yip J (WO-2021140310-A1).*

* cited by examiner

*Primary Examiner* — Phuc T Dang
(74) *Attorney, Agent, or Firm* — Dorsey & Whitney LLP

(57) ABSTRACT

A semiconductor device assembly including a substrate; a first split via including a first via land that is disposed on a surface of the substrate and that has a first footprint with a half-moon shape with a first radius of curvature, and a first via that passes through the substrate and that has a second radius of curvature, wherein the first via is disposed within the first footprint; and a second split via including a second via land that is disposed on the surface of the substrate and that has a second footprint with the half-moon shape with the first radius of curvature, and a second via that passes through the substrate and that has the second radius of curvature, wherein the second via is disposed within the second footprint, wherein the first and second via lands are disposed entirely within a circular region having the first radius of curvature.

18 Claims, 8 Drawing Sheets

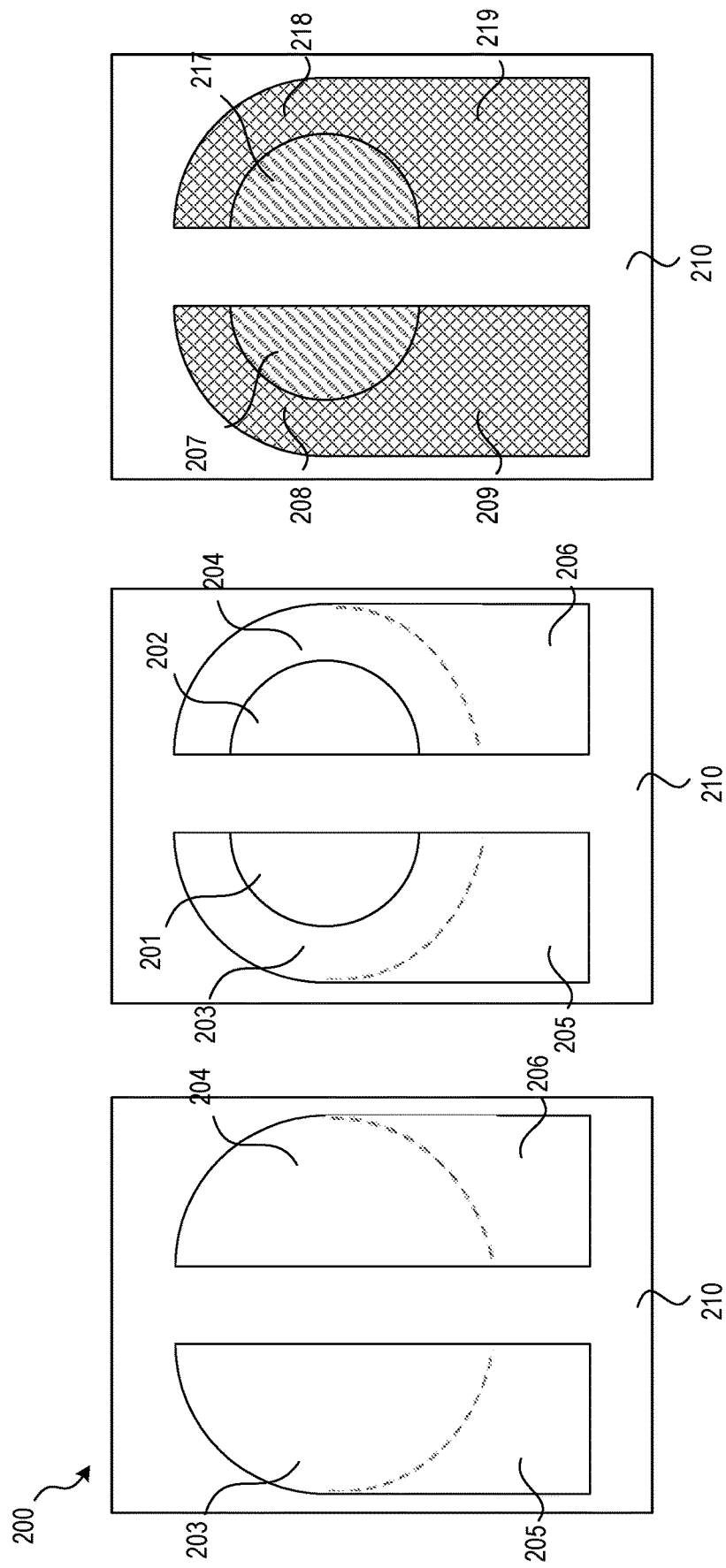

SPLIT VIA STRUCTURE FOR SEMICONDUCTOR DEVICE PACKAGING

TECHNICAL FIELD

The present disclosure generally relates to semiconductor device packaging, and more particularly relates to a split via structure configured for packaging semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under continuous pressure to reduce the volume occupied by semiconductor devices while increasing the capacity and/or speed of the resulting semiconductor assemblies. To meet these demands, semiconductor die manufacturers often stack multiple semiconductor dies vertically on top of each other and increasingly tightly pack bonding sites and rerouting structures to increase the capacity and/or the performance of semiconductor devices within a limited area on a circuit board or other element to which the semiconductor devices and/or assemblies are mounted. As components are stacked and processing demands increase, the semiconductor devices often include one or more metallization layers with varying trace paths that interconnect through vias. The varying trace paths can help equalize an effective signal travel path between signal sources and destinations to help maintain necessary parity in the timing of signals and processing between components in the semiconductor device.

BRIEF DESCRIPTION OF THE DRAWINGS

FIGS. 2A through 2C illustrate alternative stages of forming another split via structure for semiconductor packaging in accordance with embodiments of the present technology.

Figure 1C:
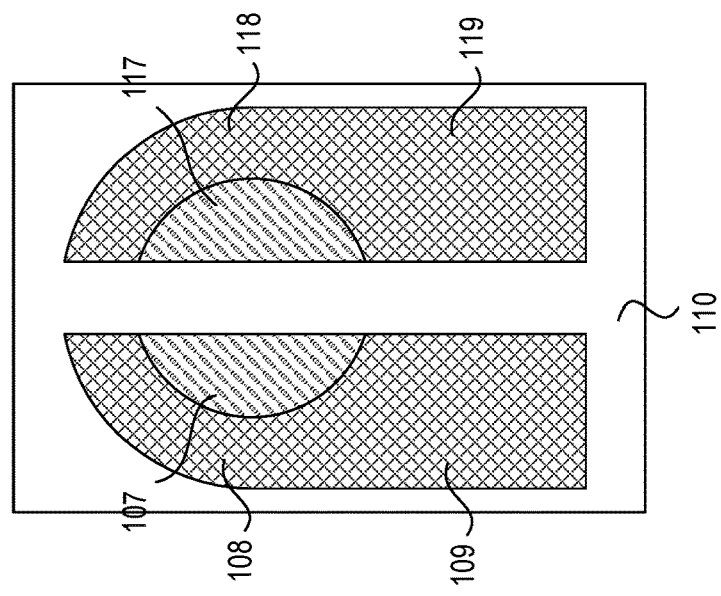
FIGS. 1A through 1C illustrate stages of forming a split via structure for semiconductor packaging in accordance with embodiments of the present technology.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

In conventional via design, each via is typically surrounded by a via land so as to accommodate overlap tolerances with metal contacts disposed above or below its circuit board layer. Even though the vias themselves may be relatively small, the via lands that surround the vias can create a substantial footprint and occupy a significant amount of surface area on the circuit board. Most conventional circuit boards now implement design rules that require a minimum via land diameter corresponding to the overlap tolerance, which leads to congested area on the circuit board due to multiple/condensed vias placement.

Additionally, typical via design limits routing spaces, i.e., individual traces cannot be routed as close together as desired, which results in irregular trace designs. This is particularly challengeable and problematic for electronic components that operate at high-speed data transfer rates because such electronic components generally use differential pair technology for data transmission over pairs of metal traces that are aligned in parallel and spaced apart from one another. When the parallel traces route through a conventional via in a congested area, they may have to divert or present in irregular traces, e.g., serpentine traces, which may increase their spacing distance and/or fail the trace length matching requirements. This also generates additional challenges to the via design because a slight variation in signal path length could create a discontinuity in the differential impedance. Further, conventional via structure may generate fragments for power signal plane design.

To address these challenges and others, the present technology applies a split via structure for the via design in the semiconductor device packaging. The split via structure includes a pair of split vias, each having a via land in a half-moon shape and a via disposed within the via land. The via lands of the pair of split vias are disposed within a single circular region corresponding to a via land in traditional via design. Specifically, the via lands of the split via structure are disposed in mirror symmetric and are separated by a gap. Each of the via lands has an arcuate edge and a chord edge. The vias disposed within each of the via lands can also be in a half-moon shape, having a radius of curvature smaller than the corresponding via land. Alternatively, the vias can have a circular cross-sectional shape and disposed within corresponding via lands.

In the present technique, the traces connected to the split via structure can have various profiles. For example, a differential pair of traces can be aligned in parallel and be connected to the pair of via lands of the split via structure respectively for differential signaling. The differential pair of traces may have inner edges aligned to the chord edges of corresponding via lands. In another example, a pair of traces can be aligned in a horizontal plane and be connected to the pair of via lands of the split via structure respectively for power signal transmission. Here, the edges of the pair of traces for power signaling may be perpendicular to the chord edge of corresponding via land. Overall, the split via structure described in the present technique can reduce the via land footprints and improve differential pair traces in satisfying the trace length matching requirements. Particularly, the described split via structure can be implemented to circuit board design in enabling routing and placement of vias in tight areas. The fabrication of the split via structure is also compatible with existing substrate processes.

Figure 1B:
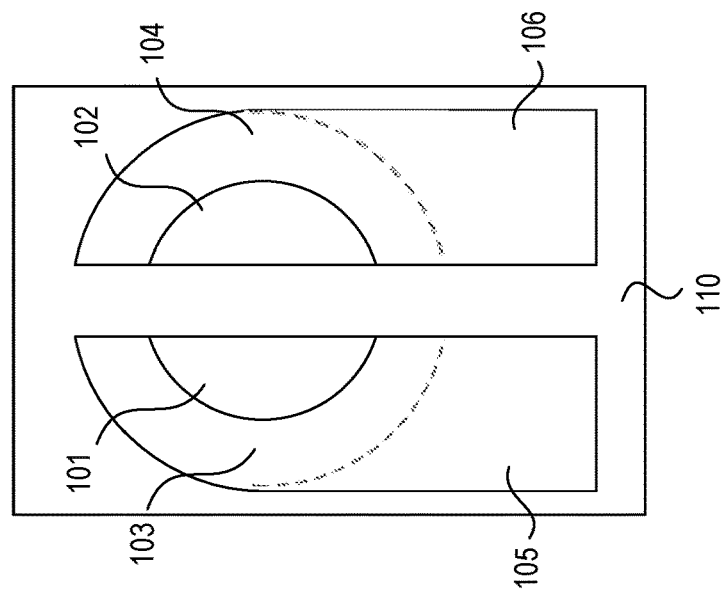
Figure 1A:
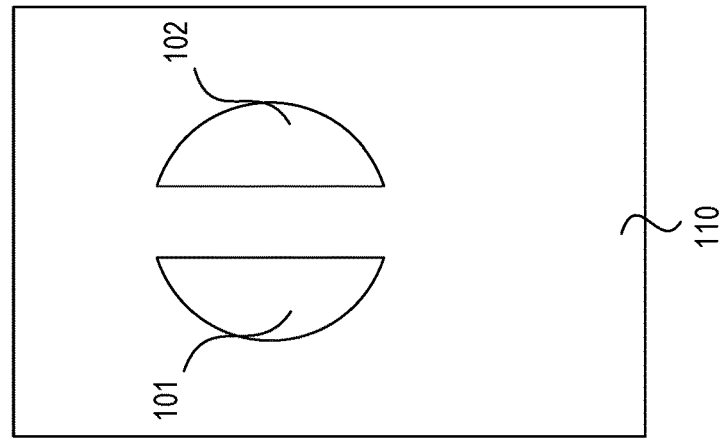

FIGS. 1A through 1C illustrate stages of forming a split via structure 100 for semiconductor packaging in accordance with embodiments of the present technology. The split via structure 100 may be processed by a via hole drilling first process on the substrate 100. FIG. 1A illustrates a top-down view of the split via structure 100 after forming a pair of via holes 101 and 102 on a substrate 110. As shown, the via holes 101 and 102 each has a half-moon shape with a first radius of curvature ranging from 25 μm to 50 μm. Specifically, each of the via holes 101 and 102 includes a first arcuate edge and a first chord edge. In this example, the via holes 101 and 102 are entirely disposed within a first circular region having a radius same to the first radius of curvature. The first arcuate edges of the via holes 101 and 102 are overlapped/aligned with the edge of the first circular region. Moreover, the via holes 101 and 102 are disposed oppositely in the first circular region, having their first chord edges aligned in parallel and separated by a gap.

In some embodiments, the pair of via holes 101 and 102 of the split via structure 100 can be formed through forming a hard mask layer above the substrate 110 and then patterning the hard mask layer to form openings corresponding to the half-moon shape of the pair of via holes 101 and 102. Various etching processes, including laser assisted etching, wet chemistry etching, dry gas etching, and/or plasma assisted etching processes can be implemented to drill the via holes 101 and 102 through the substrate 110. Those via holes can later be filled by conductive materials, e.g., in stage shown in FIG. 1C, to form the pair of vias 108. In some other embodiments, conductive materials may be filled into the holes right after they are formed in the substrate 110, to firm a pair of vias in the substrate 110.

FIG. 1B illustrate a top-down view of the split via structure 100 after forming a pair of via land openings 103 and 104 as well as a pair of trace openings 105 and 106 on a frontside surface of the substrate 110. As shown, the via land openings 103 and 104 each has a half-moon shape with a second radius of curvature ranging from 50 μm to 100 μm. Specifically, each of the via land openings 103 and 104 has a second arcuate edge (shown in solid lines and dotted lines) and a second chord edge. Here, each of the via land openings 103 and 104 are entirely disposed within a second circular region having a radius similar to the second radius of curvature. The second arcuate edges (including the solid line and dotted line) of the via land openings 103 and 104 are overlapped/aligned with the edge of the second circular region. Notably, the via land openings 103 and 104 are disposed oppositely in the second circular region, having their second chord edges aligned in parallel and separated by the gap. As shown in FIG. 1B, the via holes 101 and 102 are disposed within the via land openings 103 and 104, respectively. In particular, the centers of the first circular region and the second circular region may be overlapped. Further, the first chord edges of the via holes 101 and 102 and the second chord edges of the via land openings 103 and 104 may be also overlapped. In this example, the trace openings 105 and 106 are in parallel and connected to the via land openings 103 and 104, respectively.

In some embodiments, the via land openings 103 and 104 as well as the trace openings 105 and 106 can be formed through forming another hard mask layer above the substrate 110, followed by a patterning process to form openings on the hard mask layer corresponding to the via land openings and the trace openings. Once the hard mask openings are formed, various etching processes, e.g., laser assisted etching, wet chemistry etching, dry gas etching, and/or plasma assisted etching processes can be performed to form via land openings and the trace openings on the front side surface of the substrate 110. In some other embodiments, the via land openings 103 and 104 can be formed separately to the trace openings 105 and 106. For example, multiple rounds of hard mask patterning and substrate etching processes can be performed in sequence to form via land openings and trace openings with various thicknesses.

In some embodiments, the via land openings 103 and 104 may have a same thickness to the trace openings 105 and 106 on the frontside surface of the substrate 110. The thickness of the via land openings 103 and 104 and trace openings 105 and 106 may range from 10 μm to 30 μm. In some other embodiments, the via land openings 103 and 104 may have a larger thickness, e.g., ranging from 10 μm to 30 μm, compared to that of the trace openings 105 and 106, e.g., ranging from 5 μm to 10 μm.

In some embodiments, another pair of via land openings and another pair of trace openings may be formed on the backside surface of the substrate 110. For example, the substrate 110 can be flipped over and above-described processing steps can be repeated on the backside surface of the substrate 110 to form similar via land openings and trace openings on the backside surface of the substrate 110. Moreover, the dimension and location of the pair of via land openings on both surfaces of the substrate 110 may be identical, wherein the via land openings on the frontside surface and the backside surface of the substrate 110 can be connected by the pair of via holes 101 and 102 there through.

FIG. 1C illustrate a top-down view of the split via structure 100 after filling conductive materials into the via holes, via land openings, and trace openings described in FIGS. 1A and 1B, to form a first split via on the left-hand side and a second split via on the right-hand side. The first split via includes a via 107, a via land 108, and a trace 109 connected to the via land 108, all disposed on the left-hand side of the split via structure 100. Similarly, the second split via includes a via 117, a via land 118, and a trace 119 connected to the via land 118, all disposed on the right-hand side of the split via structure 100. In some embodiments, the pair of vias 107 and 117 can be made by different conductive materials to the pair of via lands 108 and 118 as well as the pair of traces 109 and 119. For example, a hard mask layer can be formed above the front side surface of the substrate 110 and only expose the via holes 101 and 102 for conductive material filling. Once the pair of vias 107 and 117 are formed, they can be covered by another hard mask layer, exposing the via land openings 103 and 104 as well as trace openings 105 and 106 for filling by another conductive material. In some other embodiments, the pair of vias 107 and 117, the via lands 108 and 118, as well as the traces 109 and 119 can be made of a same conductive material, i.e., concurrently filling conductive material into the via holes 101 and 102, via land openings 103 and 104, and trace openings 105 and 106. The pair of vias 107 and 117 and the pair of via lands 108 and 118 as well as the pair of traces 109 and 119 can be made of conductive materials including at least one of copper, tungsten, molybdenum, nickel, titanium, tantalum, platinum, silver, gold, ruthenium, iridium, rhenium, rhodium, or alloys thereof.

As shown in FIG. 1C, the split via structure 100 includes the pair of vias each has a half-moon shape with the first radius of curvature. In addition, each of the pair of vias 107 and 117 has the first arcuate edge and the first chord edge, entirely disposed within the first circular region. The pair of vias 107 and 117 are disposed oppositely to each other in the first circular region, having their chord edges aligned in parallel and overlapped with the chord edges of the pair of via lands 108 and 118. The traces 109 and 119 are respectively connected to the pair of vias 107 and 117 through the pair of via lands 108 and 118.

FIGS. 2A through 2C illustrate stages of forming another split via structure 200 for semiconductor packaging in accordance with embodiments of the present technology. The split via structure 200 can be processed by a via hole drilling after process on the substrate 210 and similar to the split via structure 100. For example, the split via structure 200 includes a first split via having a via 207, a via land 208, and a trace 209 connected to the via land 208, all disposed on a left-hand side of the split via structure 210. In addition, the split via structure 200 includes a second split via having a via 217, a via land 218, and a trace 219 that connected to the via land 218, all disposed on a right-hand side of the split via structure 210. FIG. 2A illustrates a top-down view of the split via structure 200 after forming a pair of via land openings 203 and 204 as well as a pair of trace openings 205 and 206 on the frontside surface of the substrate 210. Similar to the via land openings 103 and 104, the via land openings 203 and 204 each has an arcuate edge and a chord edge, in a half-moon shape with a radius of curvature ranging from 50 μm to 100 μm. Here, each of the via land openings 203 and 204 can be entirely disposed within a circular region with a radius similar to the radius of curvature. As shown, the trace openings 205 and 206 are connected to the via land openings 203 and 204 at the dotted line interfaces, respectively.

In some embodiments, the via land openings 203 and 204 as well as the trace openings 205 and 206 can be formed through forming a hard mask layer above the substrate 210 followed by a patterning process to form openings in the hard mask layer corresponding to the via land openings and trace openings. Once the hard mask openings are formed, various etching processes, e.g., laser assisted etching, wet chemistry etching, dry gas etching, and/or plasma assisted etching processes can be performed on the frontside surface of the substrate 210 through the hard mask layer to form the via land openings 203 and 204 and the trace openings 205 and 206. In some other embodiments, the via land openings 203 and 204 can be formed separately to the trace openings 205 and 206, using multiple rounds of hard mask layer patterning and substrate etching processes.

In some embodiments, the via land openings 203 and 204 may have a same thickness to the trace openings 205 and 206 on the frontside surface of the substrate 210. The thickness of the via land openings and trace openings may range from 10 μm to 30 μm. In some other embodiments, the via land openings 203 and 204 may have a larger thickness, e.g., ranging from 10 μm to 30 μm, compared to that of the trace openings 205 and 206, e.g., ranging from 5 μm to 10 μm.

FIG. 2B illustrate a top-down view of the split via structure 200 having via holes 201 and 202 respectively formed within the via land openings 203 and 204, and through the substrate 210. Similar to the via holes 101 and 102, the via holes 201 and 202 each has a half-moon shape with a radius of curvature ranging from 25 μm to 50 μm. Each of the via holes 201 and 202 has an arcuate edge and a chord edge. As shown, the via holes 201 and 202 are disposed oppositely in the split via structure 200, having their chord edges aligned in parallel and disposed next to each other. Specifically, the chord edges of the via holes 201 and 202 are overlapped/aligned with the chord edges of the via land openings 203 and 204, respectively.

In some embodiments, the via holes 201 and 202 can be formed by forming a hard mask layer above the via land openings and trace openings and on the frontside surface of the substrate 210. The hard mask layer can be patterned to form openings corresponding to the via holes 201 and 202. Various etching processes including laser assisted etching, wet chemistry etching, dry gas etching, and/or plasma assisted etching processes can be then implemented to etch the via holes 201 and 202 on the frontside surface of the substrate 210.

FIG. 2C illustrate a top-down view of the split via structure 200 after forming the vias 207 and 217, the via lands 208 and 218, and the traces 209 and 219 by conductive materials filling. In this example, the via holes 201 and 202 can be filled by a conductive material different to that of the via land openings 203 and 204 and traces openings 205 and 206. This can be done by implementing a hard mask layer above the frontside surface of the substrate 210 and alternatively open the hard mask layer to expose the via holes for via filling or expose the via land openings and trace openings for the via lands and traces filling.

In some embodiments, another pair of via lands and traces may be formed on the backside surface of the substrate 210. For example, the substrate 210 can be flipped over and above-described processing steps can be repeated on the backside surface of the substrate 210 to form similar via land openings and trace openings thereon. Moreover, the dimension and location of the pair of via land openings on both surfaces of the substrate 210 may be identical. Similar to the split via structure 100, the via land openings on the frontside surface and the backside surface of the substrate 210 can be connected by the pair of via holes 201 and 202 disposed there between.

Figure 3A:
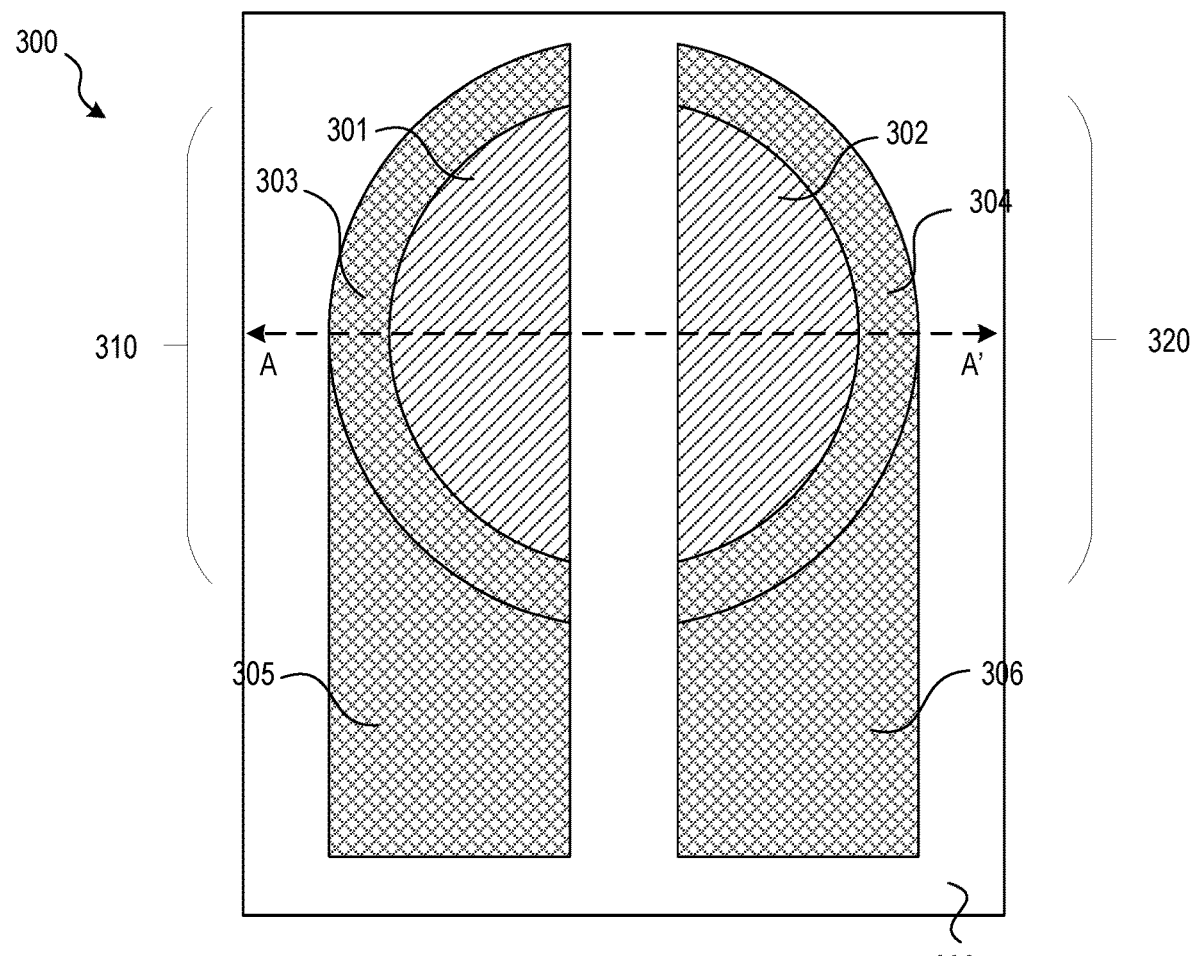
FIGS. 3A and 3B respectively illustrate a top-down view and a cross-sectional view of another split via structure connected with parallel traces for semiconductor packaging in accordance with embodiments of the present technology.
Figure 3B:
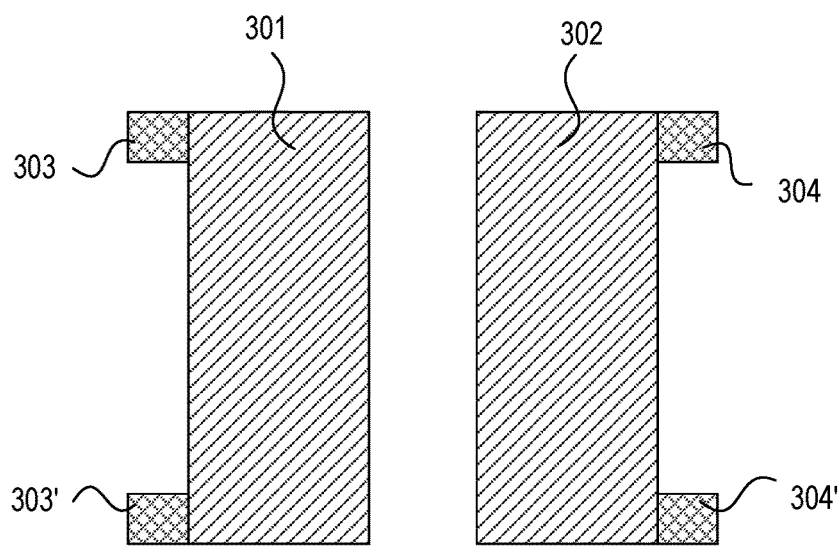

Turning to FIGS. 3A and 3B which respectively illustrate a top-down view and a cross-sectional view of another split via structure 300 connected by differential pair of traces on substrate 330 for semiconductor packaging in accordance with embodiments of the present technology. As shown in FIG. 3A, the split via structure 300 includes a first split via 310 disposed on the left and a second split via 320 disposed on the right. The first split via 310 includes a first via 301 and a first via land 303 surrounding the first via 301. The first via 301 has a half-moon shape with a first radius of curvature ranging from 25 μm to 50 μm. Specifically, the first via 301 includes an arcuate edge and a chord edge, and is entirely disposed within a first circular region having a radius same to the radius of curvature. In addition, the via land 303 has an arc shape including an outer arcuate edge, an inner arcuate edge, and chord edges disposed at both ends. The via land 303 is entirely disposed within a second circular region, having its outer arcuate edge overlapped with the edge of the second circular region and its inner arcuate edge overlapped with the arcuate edge of the via 301. As shown in FIG. 3A, a first trace 305 is electrically coupled to the first split via 310 by contacting the first via land 303 through its bottom half outer arcuate edge. In this example, the first trace 305 has two edges, an outer edge being aligned to the arc vertex of the via land 303's outer arcuate edge and an inner edge being aligned to the chord edges of the via land 303 and the chord edge of the via 301.

In this example, the second split via 320 has a similar profile to the first split via 310 and is disposed on the right side of the split via structure 300 in a mirror symmetry to the first split via 310. As shown, the second split via 320 includes a second via 320 and a second via land 304 surrounding the second via 320. Similar to the via 301, the via 302 has a half-moon shape with the first radius of curvature. It also includes an arcuate edge and a chord edge, and is entirely disposed within the first circular region in which the first via 301 also disposed. Similar to the via land 303, the via land 304 has an arc shape with an outer arcuate edge, an inner arcuate edge, and chord edges disposed at both ends. The via land 304 is also entirely disposed within the second circular region, in which the via land 303 is disposed. Similarly, the via land 304 has its outer arcuate edge overlapped with the edge of the second circular region and its inner arcuate edge overlapped with the arcuate edge of the via 302. As shown in FIG. 3B, a second trace 306 is electrically coupled to the second split via 320 by contacting the second via land 304 through its bottom half outer arcuate edge. The second trace 306 also has two edges, an outer edge being aligned to the arc vertex of the via land 304's outer arcuate edge and an inner edge being aligned to the chord edges of the via land 304 and the chord edge of the via 302. In this example, the traces 305 and 310 are aligned in parallel and can be configured to transfer differential signals.

FIG. 3B illustrate the cross-sectional view of the split via structure 300 along the A-A' plane shown in FIG. 3A. This cross-sectional view shows that the split via structure 300 may also include via lands 303' and 304' disposed on the other surface of the substrate 330. Specifically, the vias 301 and 302 each passes through the substrate 330 and interconnects the via lands of each of the first and second split vias, respectively. In this cross-sectional view, the via lands 303 and 303' and via 301 of the first split via 310 are disposed in symmetry to the via lands 304 and 304' and via 302 of the second split via 320. The first split via 310 and the second split via 320 are separated by a gap having a width close to 25 μm. In this example, each of the vias 301 and 302 may have a height ranging from 100 μm to 160 μm and a width close to 50 μm. Further, each of the via lands 303 and 303' may have a thickness ranging from 10 μm to 30 μm and a width close to 20 μm.

The split via structure 300 can be processed through the stages described in FIGS. 1A through 1C or FIGS. 2A through 2C. For example, as illustrate in the FIG. 1A, the vias 301 and 302 can be firstly fabricated by thrilling via holes through the substrate 330. The patterning of via lands openings and trace openings on the substrate 330 can be followed up. A single step conductive material filling process or multiple steps conductive materials filling process can be further conducted to finalize the split via structure 300 shown in the FIGS. 3A and 3B. In another example and as illustrated in FIGS. 2A through 2C, the via land openings and trace openings can be firstly processed and followed by a via hole openings process. The vias and via lands of the split via structure 300 can be made of conductive materials including at least one of copper, tungsten, molybdenum, nickel, titanium, tantalum, platinum, silver, gold, ruthenium, iridium, rhenium, rhodium, or alloys thereof.

The split via structure 300 illustrated in FIGS. 3A and 3B can be implemented to via design in advanced semiconductor device packaging. In particular, the individual via lands 303 and 304 of the split via structure 300 has a smaller footprint compared to conventional via lands in circular shape, e.g., having a footprint at least half or less to that of conventional via lands. The reduced footprint of the via lands in the split via structure of the present technology helps save more space on the circuit board, avoiding or reducing irregular traces including serpentine traces that generally are needed to match trace length in traditional via design. The reduced footprint of via lands in the split via structure 300 can also save more room for power and ground planes enhancement on the circuit board. Further, an optimized trace matching between the differential pair, e.g., the traces 305 and 306 in this example, can be achieved by eliminating a far via to via placement requirement through implementing the described split via structure.

Figure 4A:
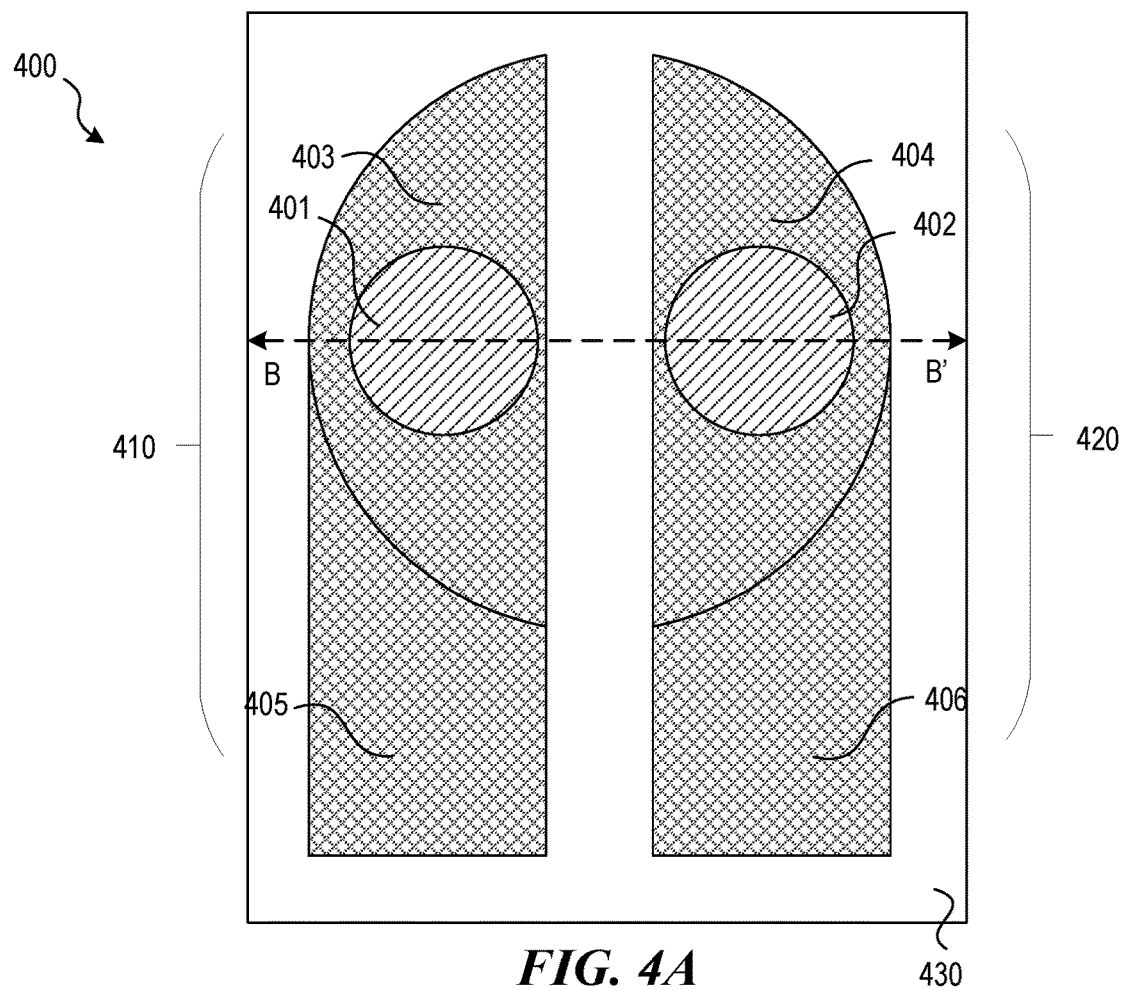
FIGS. 4A and 4B respectively illustrate a top-down view and a cross-sectional view of another split via structure connected with parallel traces for semiconductor packaging in accordance with embodiments of the present.
Figure 4B:
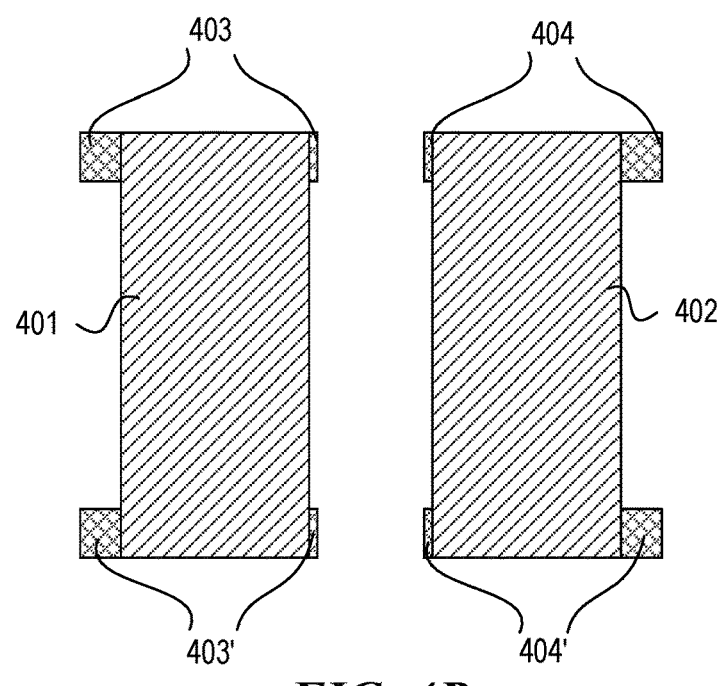

FIGS. 4A and 4B respectively illustrate a top-down view and a cross-sectional view of another split via structure 400 that includes micro vias and that is connected by differential pair of traces for semiconductor packaging in accordance with embodiments of the present. The top-down view of the split via structure 400 illustrates a first split via 410 disposed on the left and a second split via 420 disposed on the right. The first split via 410 includes a first micro via 401 and a first via land 403 within which the first micro via 401 is disposed. The first micro via 401 passes through the substrate 410 and has a circular cross-sectional shape with a first diameter. The first via land 403 includes an arcuate edge and a chord edge, and has a half-moon shape with a first radius of curvature. Further, the first via land 403 is entirely disposed within a circular region having the first radius. As shown in FIG. 4A, a first trace 405 is electrically coupled to the first split via 410 by contacting the first via land 403 through its bottom half outer arcuate edge. The second split via 420 includes a second micro via 402 and a second via land 404 which have a same profile and are disposed in mirror symmetric to the first micro via 401 and the first via land 403 of the first split via 410, respectively. In particular, the second via land 404 has a half-moon shape and is entirely disposed within the circular region in which the first via land 403 is also disposed. Moreover, a second trace 406 is electrically coupled to the second split via 420 by contacting the second via land 404 through its bottom half outer arcuate edge. In this example, the traces 405 and 406 are in parallel, each having an outer edge being aligned to the arc vertex of the via land 403 or 404 and an inner edge being aligned to the chord edges of the via lands 403 or 404. Specifically, each of the traces 405 and 406 may have a width same to a lateral width of the via lands 403 and 404 which is along an axis perpendicular to their chord edges.

FIG. 4B illustrate the cross-sectional view of the split via structure 400 along the B-B' plane shown in FIG. 4A. This cross-sectional view shows that the split via structure 400 may also include via lands 403' and 404' disposed on the other surface of the substrate 430. Specifically, the vias 401 and 402 each passes through the substrate 430 and interconnects the via lands of each of the first and second split vias, respectively. In this cross-sectional view, the via lands 403 and 403' and via 401 of the first split via 410 are disposed in symmetry to the via lands 404 and 404' and via 402 of the second split via 420. The first split via 410 and the second split via 420 are separated by a gap having a width close to 25 μm. In this example, each of the vias 401 and 402 may have a height ranging from 100 μm to 160 μm and a width close to 45 μm. Further, each of the via lands 403 and 403' may have a thickness ranging from 10 μm to 30 μm and a width close to 70 μm.

In this example, the via split structure 400 may be processed by the via hole drilling first process illustrated in FIGS. 1A through 1C or the via hold drilling after process illustrated in FIGS. 2A through 2C. Similar to the split via structure 300, the vias and via lands of the split via structure 400 can be made of a same conductive filling material or different conductive filling materials. The vias and via lands of the split via structure 400 can be made of conductive materials including at least one of copper, tungsten, molybdenum, nickel, titanium, tantalum, platinum, silver, gold, ruthenium, iridium, rhenium, rhodium, or alloys thereof.

Figure 5A:
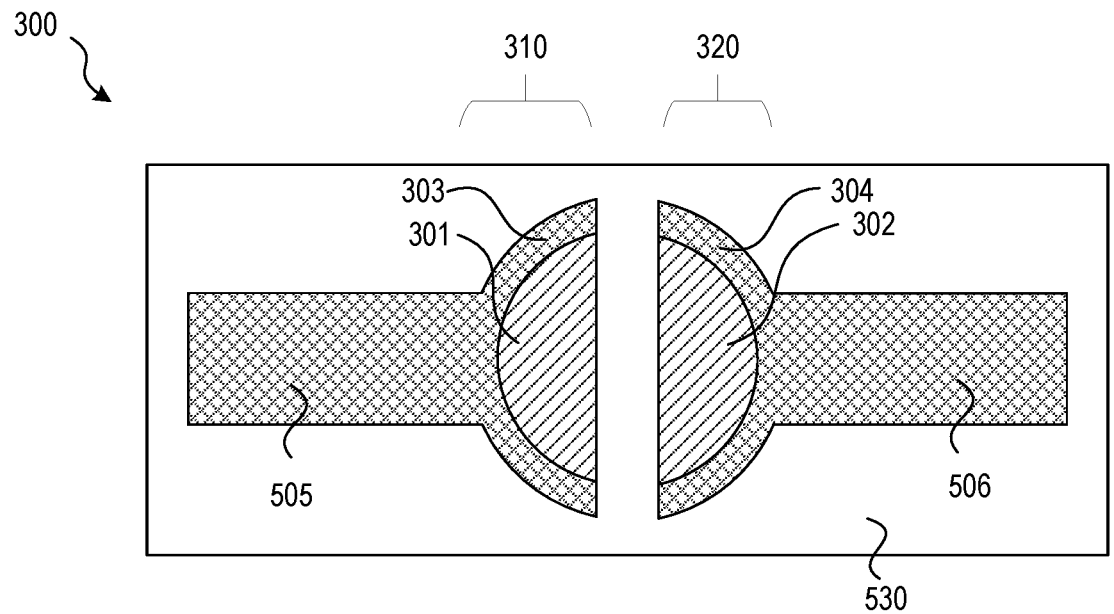
FIGS. 5A and 5B respectively illustrate top-down views of the split via structures shown in FIGS. 3A and 4A with different traces connections for semiconductor packaging in accordance with embodiments of the present technology.

Turning to FIG. 5A which illustrates another top-down view of the split via structure 300 with a different traces connection for semiconductor packaging in accordance with embodiments of the present technology. Specifically, the split via structure 300 is connected by two traces 505 and 506 that are aligned in a same horizontal plane. As described in FIG. 3A, the split via structure 300 includes a first split via 310 disposed on the left and a second split via 320 disposed on the right. Here, the first trace 505 is electrically coupled to the first split via 310 by contacting the first via land 303 through a first edge location, i.e., a center portion of the via land 303's outer arcuate edge. In this example, both edges of the first trace 505 are perpendicular to the chord edge of the via 301. Similarly, the second trace 506 is electrically coupled to the second split via 320 by contacting the second via land 304 through a second edge location, i.e., a center portion of the via land 304's outer arcuate edge. In this example, both edges of the second trace 506 are perpendicular to the chord edge of the via 302. The first trace 505 and the second trace 506 can be aligned in a same horizontal plane, as shown in FIG. 5A, and are disposed on the left side and the right side of the split via structure 300, respectively. Moreover, the first edge location and the second edge location are disposed oppositely in the circular region within which the first and second via lands 303 and 304 are disposed. In some embodiments, the first and second traces 505 and 506 can be configured to transmit power signals. For example, the trace 505 can be used to transfer a negative supply voltage Vss and the trace 506 can be used to transfer a positive supply voltage Vdd.

Figure 5B:
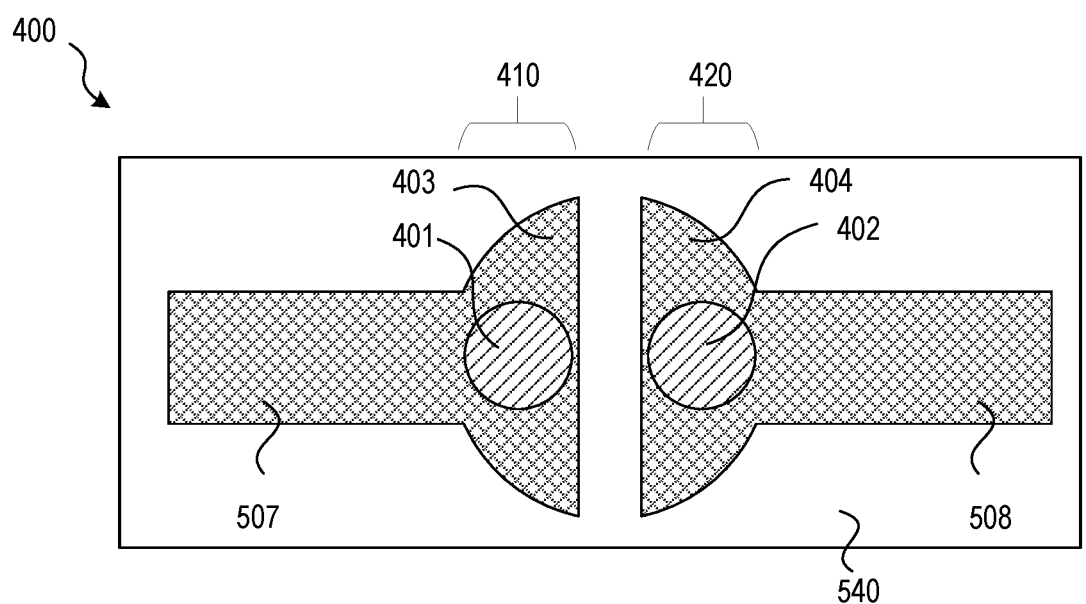

FIG. 5B illustrates another top-down view of the split via structure 400 with a different traces connection for semiconductor packaging in accordance with embodiments of the present technology. Specifically, the split via structure 400 is connected by two traces 605 and 606 that are aligned in a same horizontal plane. As shown, the split via structure 400 includes a first split via 410 disposed on the left and a second split via 420 disposed on the right. Each of the vias 401 and 402 is in a circular cross-sectional shape and entirely disposed with in the via land 403 and 403, respectively. Here, a first trace 507 is electrically coupled to the first split via 410 by contacting the first via land 403 through a third edge location, i.e., a center portion of the via land 403's outer arcuate edge. In this example, both edges of the first trace 507 are perpendicular to the chord edge of the via land 403. Similarly, a second trace 508 is electrically coupled to the second split via 420 by contacting the second via land 404 through a fourth edge location, i.e., a center portion of the via land 404's outer arcuate edge. In this example, both edges of the second trace 508 are perpendicular to the chord edge of the via land 404. The first trace 507 and the second trace 508 can be aligned in a same horizontal plane, as shown in FIG. 5B, and disposed on the left side and the right side of the split via structure 400, respectively. Moreover, the third edge location and the fourth edge location are disposed oppositely in the circular region within which the first and second via lands 403 and 404 are disposed. In some embodiments, the first and second traces 507 and 508 can be configured to transmit power signals. For example, the trace 507 can be used to transfer a negative supply voltage Vss and the trace 508 can be used to transfer a positive supply voltage Vdd.

Figures 6A, 6B:
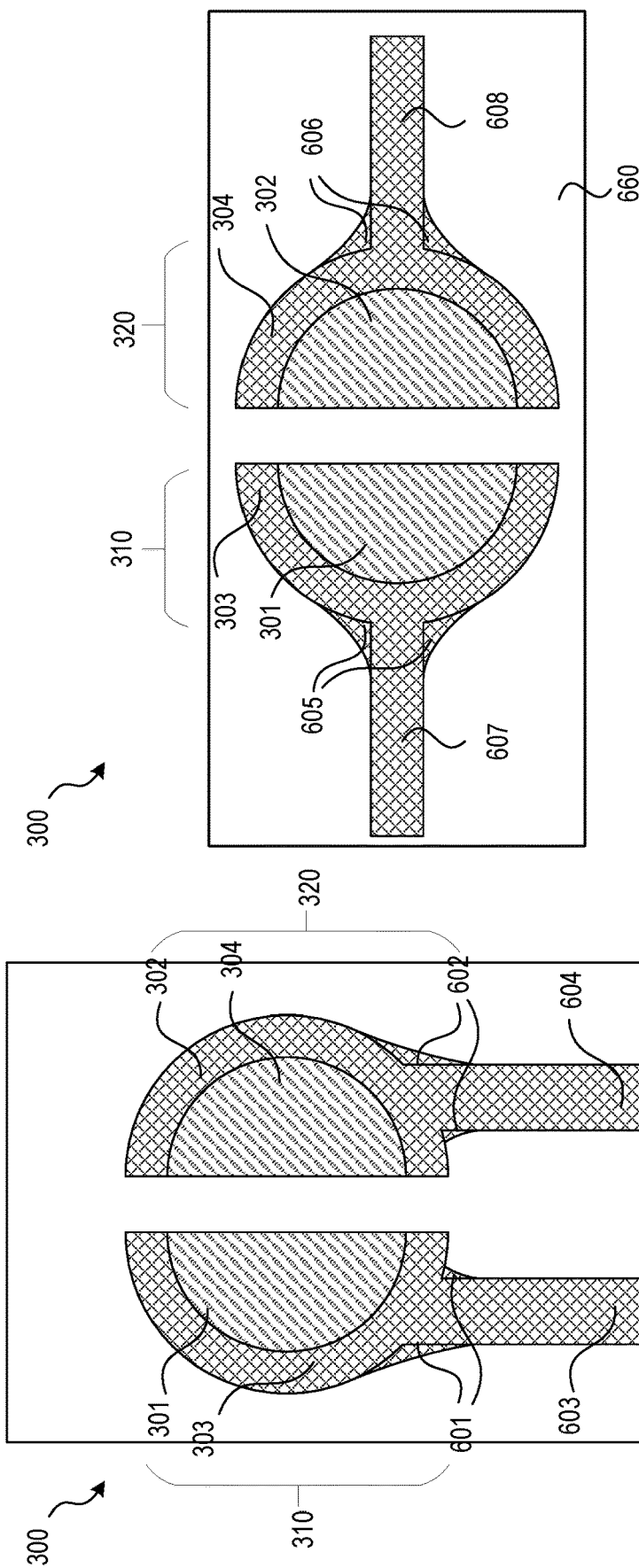
FIGS. 6A and 6B illustrate top-down views of the split via structure shown in FIG. 3A with various traces connections for semiconductor packaging in accordance with embodiments of the present.

FIGS. 6A and 6B illustrate top-down views of split via structure 300 having various traces connections for semiconductor packaging in accordance with embodiments of the present. FIG. 6A illustrates a pair of traces 603 and 604 that are disposed in parallel and are respectively connected to the first split via 310 and the second split via 320. In particular, each of the traces 603 and 604 has a width smaller than the lateral width of the via lands 303 and 304, i.e., the distance from the arc vertex of the via land's outer arcuate edge to the chord edge of embedded via. As shown in FIG. 6A, the trace 603 may be connected to the via land 303 at a first arcuate edge location and laterally aligned to a middle region of the via land 303 along its lateral width. Further, the trace 603 may also include necking regions 601 at both edges of the trace 603 and close to the arcuate edge location, in order to strengthen the interconnection there between. The trace 604 may have a similar profile to the trace 603 and they can be in a mirror symmetric, e.g., in parallel, when connected to the split vias 310 and 320. For example, the trace 604 may be connected to the via land 304 at a second arcuate edge location and laterally aligned to a middle region of the via land 304 along its lateral width. The first and second arcuate edge locations are opposite in the second circular region in which the via lands 303 and 304 are disposed. The trace 604 also include necking regions 602 that are configured to strengthen the interconnection between the trace 604 and the via land 304.

FIG. 6B illustrates the split via structure 300 that is connected by two traces 607 and 608 which are aligned in a same horizontal plane. As shown, each of the traces 607 and 608 are perpendicular to the chord line of corresponding via lands. Here, the width of the traces 607 and 608 may be smaller than that of the traces 505 and 506, e.g., having a width less than the lateral width of the corresponding via lands. Similarly, the traces 607 and 608 may include necking regions 605 and 606 respectively so as to strengthen the interconnection between the trace and corresponding via land. In some other embodiments, the traces 603, 604, 607 and 608 described in FIGS. 6A and 6B can be implemented to be connected to other split via structures, e.g., the split via structure 400 which includes a pair of vias in circular cross-sectional shape shown in FIGS. 4A and 4B.

The traces with an adjustable width described in FIGS. 6A and 6B provide a feasibility to increase the trace width or adjust the space between differential pair of traces in order to satisfy various via/trace design rules and applications. For example, the split via structure and applicable traces connections described above in this disclosure can enable NAND flash memory devices, MNAND devices, and/or Low Power Double Data Rate (LPDDR) devices package size scaling, e.g., from current 11.5 mm×13 mm to 9 mm×13 mm. In addition, the smaller via land footprints in the split via structures of the present technology enables a smooth trace design. For example, curved travel paths or serpentine segments of traces can be effectively reduced because of the resulted more estate room on the circuit board.

Figure 7:
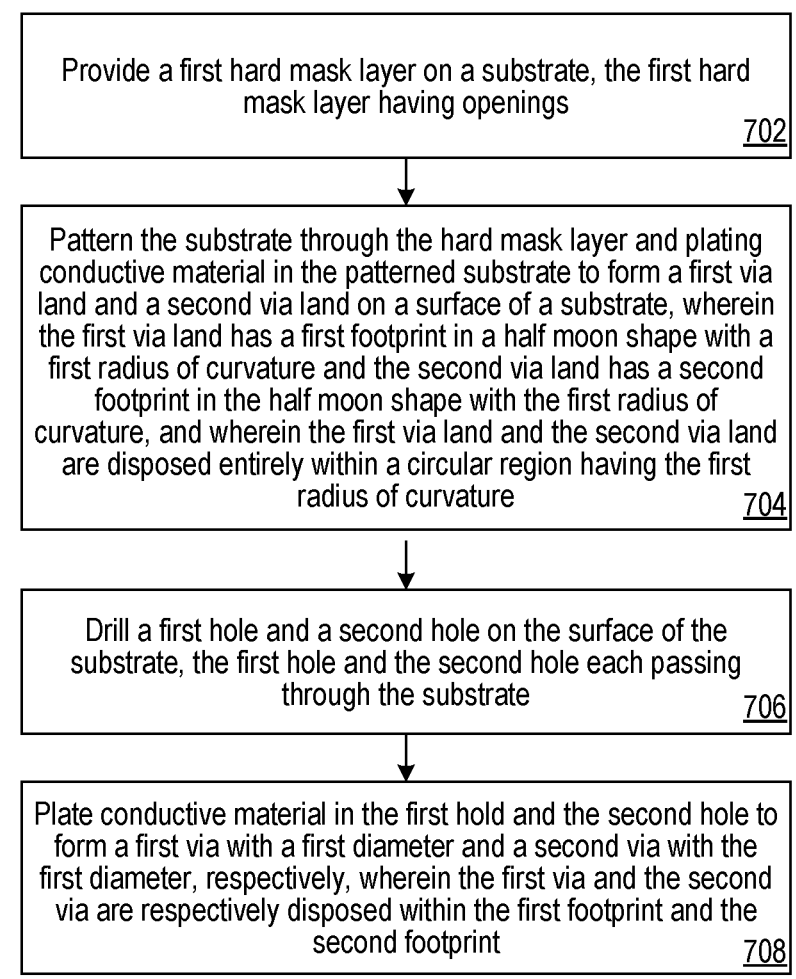
FIG. 7 illustrates a method of forming a split via structure for semiconductor packaging according to embodiments of the present technology.

FIG. 7 illustrates a method 700 of forming a split via structure for semiconductor packaging according to embodiments of the present technology. The method 700 includes providing a first hard mask layer on a substrate, the first hard mask layer having openings, at 702. For example, a hard mask layer can be formed above the substrate 210. The hard mask layer can be patterned to form openings corresponding to the via lands 203 and 204 as shown in FIG. 2A. In some other examples, the hard mask layer can also be patterned to form openings corresponding to the traces 205 and 206.

The method 700 also includes patterning the substrate through the hard mask layer and plating conductive material in the patterned substrate to form a first via land and a second via land on a surface of a substrate, wherein the first via land has a first footprint in a half moon shape with a first radius of curvature and the second via land has a second footprint in the half moon shape with the first radius of curvature, and wherein the first via land and the second via land are disposed entirely within a circular region having the first radius of curvature, at 704. For example, various etch processes including laser assisted etching, wet chemistry etching, dry gas etching, and/or plasma assisted etching processes can be performed on the frontside surface of the substrate 210 through the hard mask layer openings to form the via land openings 203 and 204 and the trace openings 205 and 206. In some other examples, the via land openings 203 and 204 can be formed separately to the trace openings 205 and 206, using multiple sequences of hard mask layer patterning and substrate etching processes. As shown in FIG. 2A, each of the via lands 203 and 204 has a half-moon shape with a first radius of curvature. Further, both of the via lands 203 and 204 are disposed with in a circular region having the first radius. Conductive materials, e.g., copper, can be filled into the via land openings 203 and 204 to form the via lands 208 and 218 shown in FIG. 2C.

In addition, the method 700 includes drilling a first hole and a second hole on the surface of the substrate, the first hole and the second hole each passing through the substrate, at 706. For example, another hard mask layer can be patterned above the substrate 210 and form hard mask layer openings corresponding to the via holes 201 and 202 as shown in FIG. 2B. The via holes 201 and 202 can be formed by drilling the substrate 210 through the hard mask layer openings. Specifically, the via holes 201 and 202 are disposed within the footprints of via lands 203 and 204, respectively.

Lastly, the method 700 includes plating conductive material in the first hold and the second hole to form a first via with a second radius of curvature and a second via with the second radius of curvature, respectively, wherein the first via and the second via are respectively disposed within the first footprint and the second footprint, at 708. For example, conductive material, e.g., copper, can be filled in the via holes 201 and 202 to form vias 207 and 217 shown in FIG. 2C. In particular, the vias 207 and 217 are disposed within the footprints of the via lands 208 and 218, respectively.

Figure 8:
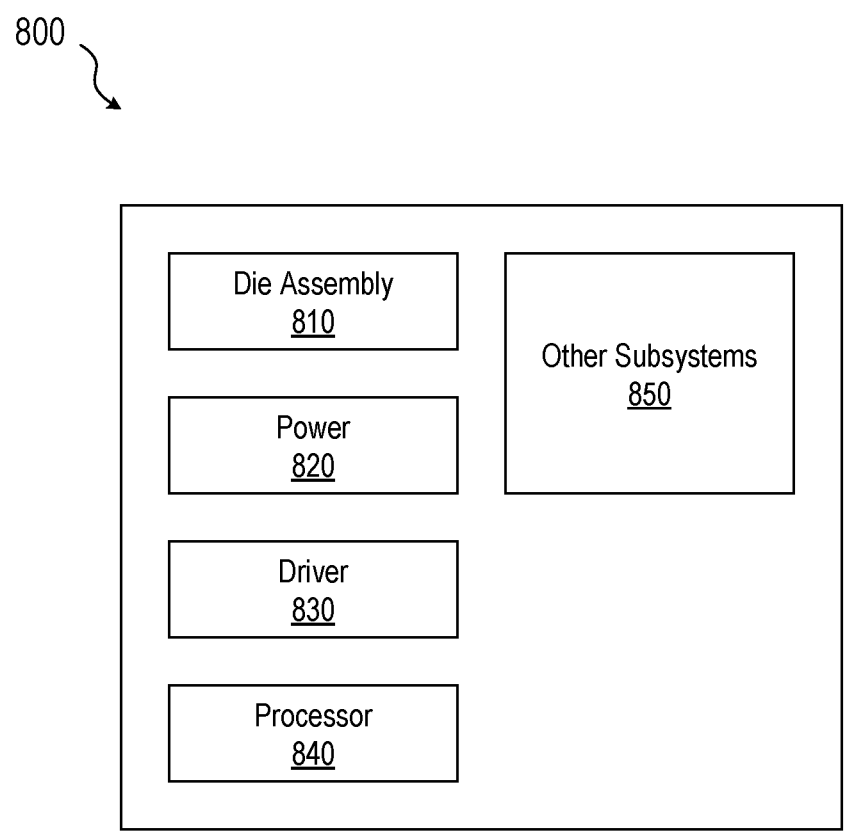
FIG. 8 is a schematic view of a system that includes a semiconductor device configured according to embodiments of the presented technology.

Any one of the semiconductor structures described above with reference to FIGS. 1A-6B can be incorporated into any of a myriad of larger and/or more complex systems, a representative example of which is system 800 shown schematically in FIG. 8. The system 800 can include a semiconductor device 810, a power source 820, a driver 830, a processor 840, and/or other subsystems or components 850. The semiconductor device 810 can include features generally similar to those of the semiconductor devices described above, and can therefore include the split via structures and semiconductor device assemblies described in the present technology. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, and appliances. Components of the system 800 may be housed in a single unit or distributed over multiple, interconnected units (e.g., through a communications network). The components of the system 800 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (Fe RAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a substrate;
a first split via including a first via land that is disposed on a surface of the substrate and that has a first footprint with a half-moon shape with a first radius of curvature, and a first via that passes through the substrate and that has a second radius of curvature, wherein the first via is disposed within the first footprint; and
a second split via including a second via land that is disposed on the surface of the substrate and that has a second footprint with the half-moon shape with the first radius of curvature, and a second via that passes through the substrate and that has the second radius of curvature, wherein the second via is disposed within the second footprint,
wherein the first via land and the second via land are disposed entirely within a circular region having the first radius of curvature, and
wherein the first via land and the second via land are symmetric in the circular region and isolated by a first gap.

2. The semiconductor device assembly of claim 1, wherein the first via land and the second via land each has a first arcuate edge and a first chord edge.

3. The semiconductor device assembly of claim 2, further comprising a pair of traces including a first trace electrically coupled to the first via land with a trace width and a second trace electrically coupled to the second via land with the trace width.

4. The semiconductor device assembly of claim 3, wherein the first trace is coupled to the first via land at a first edge location of the circular region, wherein the second trace is coupled to the second via land at a second edge location of the circular region.

5. The semiconductor device assembly of claim 4, wherein the pair of traces are a differential pair, in which the first trace and the second trace are in parallel and separated by a second gap.

6. The semiconductor device assembly of claim 5, wherein the first gap and the second gap have a same width, and wherein the pair of traces each has an inner edge substantially aligned with the first chord edge of the first via land and the second via land, respectively.

7. The semiconductor device assembly of claim 6, wherein the trace width of each of the pair of traces is equal to a lateral width along an axis perpendicular to the chord edge of each of the first via land and the second via land.

8. The semiconductor device assembly of claim 5, wherein the first gap is smaller than the second gap, and the trace width of the pair of traces is smaller than a lateral width along an axis perpendicular to the chord edge of each of the first via land and the second via land.

9. The semiconductor device assembly of claim 4, wherein the second edge location is opposite to the first edge location in the circular region.

10. The semiconductor device assembly of claim 4, wherein trace edges of the first trace and the second trace are perpendicular to the first chord edges of the first via land and the second via land, respectively.

11. The semiconductor device assembly of claim 2, wherein the first via and the second via each has a second arcuate edge smaller than the first arcuate edge and a second chord edge shorter than the first chord edge.

12. The semiconductor device assembly of claim 11, wherein the second chord edges of the first via and the second via are overlapped with the first chord edges of the first via land and the second via land, respectively.

13. A semiconductor device assembly, comprising:
a substrate;
a first split via including a first via land that is disposed on a surface of the substrate and that has a first footprint with a half-moon shape with a first radius of curvature, and a first micro via that passes through the substrate and that has a circular cross-sectional shape with a first diameter, wherein the first micro via is disposed within the first footprint; and
a second split via including a second via land that is disposed on the surface of the substrate and that has a second footprint with the half-moon shape with the first radius of curvature, and a second micro via that passes through the substrate and that has the circular cross-sectional shape with the first diameter, wherein the second micro via is disposed within the second footprint,
wherein the first via land and the second via land are disposed entirely within a circular region having the first radius of curvature.

14. The semiconductor device assembly of claim 13, further comprising a pair of traces including a first trace electrically coupled to the first via land with a trace width at a first edge location of the circular region and a second trace electrically coupled to the second via land with the trace width at a second edge location of the circular region, wherein the first via land and the second via land each has a first arcuate arc edge and a chord edge.

15. The semiconductor device assembly of claim 14, wherein the first via land and the second via land are symmetric in the circular region and isolated by a first gap, and wherein the pair of traces are a differential pair, in which the first trace and the second trace are in parallel and separated by a second gap.

16. The semiconductor device assembly of claim 15, wherein the first gap and the second gap have a same width, wherein the pair of traces each has an inner edge substantially aligned with the first chord edge of the first via land and the second via land, respectively, and wherein the trace width of each of the pair of traces is equal to a lateral width along an axis perpendicular to the chord edge of each of the first via land and the second via land.

17. The semiconductor device assembly of claim 15, wherein the first gap is smaller than the second gap, and the trace width of the pair of traces is smaller than a lateral width along an axis perpendicular to the chord edge of each of the first via land and the second via land.

18. The semiconductor device assembly of claim 14, wherein the second edge location is opposite to the first edge location in the circular region, and wherein trace edges of the first trace and the second trace are perpendicular to the first chord edges of the first via land and the second via land, respectively.

* * * * *